(12) United States Patent
Mateman

(10) Patent No.: US 6,693,463 B2
(45) Date of Patent: Feb. 17, 2004

(54) CURRENT MODE DEVICE AND AN ARRANGEMENT

(76) Inventor: Paul Mateman, Gerstweg 2, 6534 AE Nijmegen (NL)

( * ) Notice: Subject to any disclaimer, the term of this patent is extended or adjusted under 35 U.S.C. 154(b) by 127 days.

(21) Appl. No.: 10/095,491

(22) Filed: Mar. 12, 2002

(65) Prior Publication Data

US 2002/0130688 A1 Sep. 19, 2002

(30) Foreign Application Priority Data

Mar. 14, 2001 (EP) .............................. 01200959

(51) Int. Cl.$^7$ .......................... H03K 19/086; H03F 3/45
(52) U.S. Cl. .......................... 326/127; 326/75; 330/254
(58) Field of Search ............................ 326/126, 127, 326/115, 75, 77, 78; 330/252–255, 262–264

(56) References Cited

U.S. PATENT DOCUMENTS

| | | | | |
|---|---|---|---|---|
| 4,795,916 A | * | 1/1989 | Liron | 326/89 |
| 4,980,582 A | * | 12/1990 | Waller et al. | 326/90 |
| 5,148,060 A | * | 9/1992 | Ohba et al. | 326/66 |
| 5,216,298 A | | 6/1993 | Ohba et al. | 326/64 |
| 5,602,498 A | | 2/1997 | Satoh et al. | 326/126 |
| 5,754,062 A | * | 5/1998 | Satoh et al. | 326/126 |
| 5,798,658 A | | 8/1998 | Werking | 326/17 |
| 5,977,800 A | * | 11/1999 | Iravani | 326/115 |
| 6,251,330 B1 | * | 6/2001 | Johnard et al. | 264/462 |
| 6,320,422 B1 | * | 11/2001 | Koh | 326/115 |
| 6,552,577 B1 | * | 4/2003 | Tam | 326/126 |

FOREIGN PATENT DOCUMENTS

| | | | |
|---|---|---|---|
| EP | 0381120 A2 | 8/1990 | ......... H03K/19/177 |
| JP | 2001024504 | 1/2001 | ......... H03K/19/084 |
| WO | WO 9505033 A1 * | 2/1995 | ......... H03K/19/018 |

OTHER PUBLICATIONS

High–Performance Standard Cell Library and Modeling Technique for Differential Advanced Bipolar Current Tree Logic, May 1, 1991; pp. 749–762; XP000228232.

* cited by examiner

Primary Examiner—James H. Cho
(74) Attorney, Agent, or Firm—Aaron Waxler

(57) ABSTRACT

The invention relates to a current mode device (CMD). The CMD comprises a first, a second and a third pairs of voltage controlled current sources (CCS). The first pair has an active load that is controlled by the third pair. The first pair provides a first and a second output signal that drive the second pair. The second pair generates a first digital output signal and a second output digital signal depending on a first input signal and on a second input signal, respectively. The CMD further comprises a first, a second and a third current sources that supply a first current (C1) in the first pair, a second current (C2) in the second pair and a third current (C3) in the third pair. The overall delay depends on a ratio between C1 and C2 and the sharpness of the edges of the signals depend on a ratio between C1 and C3, respectively. Furthermore, the second pair controls the amplification of the first pair by controlling the impedance of the active load.

5 Claims, 3 Drawing Sheets

CURRENT MODE DEVICE AND AN ARRANGEMENT

BACKGROUND OF THE INVENTION

The invention relates to a current mode device, in the sequel also denoted as CMD, being supplied via a first supply terminal and a second supply terminal, in the sequel also denoted as CMD, comprising a first pair of voltage controlled current sources (CCS) being supplied by a first current source adapted to supplying a first current, the first pair of CCS having a first input, a second input, a first output and a second output, first input being coupled to a first input terminal adapted to transmit a first input signal and the second input being coupled to a second input terminal adapted to transmit a second input signal, the CMD further comprises a second pair of CCS being supplied by a second current source adapted to supplying a second current, the second pair of CCS having a third input, a fourth input, a third output and a fourth output, the third input being coupled with the first output and the fourth input being coupled with the second output for generating a first logical output signal at the third output and a second logical output signal at the fourth output depending on the first input signal and on the second input signal, respectively, the CMD further comprises an active load circuit being coupled to the first pair of CCS via the first output and via the second output.

The invention further relates to a communication arrangement comprising the current mode circuit.

Current mode devices (CMD) are widely used in high speed digital circuits being well known as emitter-coupled logic (ECL) circuits when they are realized in bipolar technology or as source-coupled logic (SCL) circuits when they are realized in CMOS technology. The basic CMD is the inverter/buffer that is used as an input and/or output device in order to provide sharp edges for a digital signal.

For such an inverter/buffer it is desirable to be able to work at it's input with digital signals with relatively slow edges and to provide at it's output digital signals with sharp edges and sufficient energy to be transmitted unaltered in relatively large digital networks.

Digital signal edges deteriorate when the respective signals are transmitted on relatively long transmission lines, when, because of parasitic elements of the transmission line (e.g. parasitic capacitance) the signal is integrated. It should be pointed out here that when relatively high frequency signals are involved, a connection within a chip could be considered to be a relatively long transmission line. A digital network of any kind (optical, electrical, radio-electrical) could be considered to be a long transmission line, too.

A current mode device as described in the opening paragraph is disclosed in U.S. Pat. No. 5,798,658. It comprises a SCL circuit having a differential pair of CMOS transistors being supplied by a current source. The differential pair of CMOS transistors has a load in each of their drains realized with CMOS transistors used as active resistors, the value of their resistance being controlled by a voltage generated by a bias circuit. The drains of the SCL circuit are further coupled to output CMOS transistors connected as source followers, an output signal being obtained in the sources of the output transistors. Furthermore, in the sources of the output transistors, pull down CMOS transistors that are also controlled by the bias circuit are provided, too. It should be pointed out here that because of the source follower transistors the power gain of the circuit is relatively low.

It is therefore an object of the present invention to providing a current mode device having an improved power gain.

In accordance with the invention, this object is achieved in a device as described in the introductory paragraph, which is characterized in that the current mode device further comprises a third pair of CCS being supplied by a third current source adapted to supplying a third current the third pair of CCS having a fifth input and a sixth input coupled to the first input terminal and to the second input terminal, respectively, for providing a fifth output signal at a fifth output and a sixth output signal at a sixth output for controlling an amplification of the first input signal and the second input signal through the first pair of CCS.

The device according to the invention has the advantage of a better power gain at a relatively high frequency of operation providing at its outputs digital signals that have relatively sharp edges. The ratio between the third current C3 and the first current C1 controls the switching speed of the first pair of CCS improving the edges of the signals passing through it. The ratio between the first current C1 and the second current C2 controls the overall delay of the circuit. Because the edges of the input signal are made relatively sharp in the first pair of CCS, the second pair of CCS can be arrange to provide an improved power gain in comparison with the prior art (e.g. common emitter pair instead of common drain pair).

In an embodiment of the invention the active load of the first differential pair of CCS is controlled by the fifth output O3 and the sixth output O3n. The current C3 determines a static supplying current in the active load. The input signals I and In modulate this static supplying current. This has the effect that the active load impedance is dependent on the instant value of the input signals.

In a preferred embodiment of the invention the signal at the first output O1 and the signal at the fifth output O3 are substantially in phase, and the signal at the second output O1n and the signal at the sixth output O3n, are substantially in phase, too. If the phase of the input signal I slightly differs from the phase of the input signal In, then this difference is controllably amplified by the first pair of CCS, shortening the input signal delay through the device, the overall delay being dependent on a ratio between the currents C1 and C3. The signals obtained at the first output O1 and the second output O1n drive the third input I2 and the fourth input I2n, respectively. The second pair of CCS, supplied by the second current C2, have a relatively high power gain, the overall power gain of the device being relatively high. Furthermore, because of the relatively high power gain, the edges of the first output signal O and the second output signal On are relatively sharp. It should be pointed out here that the overall delay through the device is further dependent on a ratio between the second current C2 and the first current C1.

It is another object of the present invention to provide a communication arrangement comprising an emission module coupled with a reception module via a bi-directional communication channel, further comprising in the emission module and in the reception module the current mode circuit as claimed in claim 1. It should be pointed out here that if the communication channel is a long line (a computer network, e.g.) the edges of the digital signals circulating through it deteriorate especially because of the parasitic impedance (capacitors, inductors, e.g.) of the channel.

Furthermore, if a very high frequency chip is considered, the connection lines within the chip behave as a transmission line deteriorating the edges of the digital signals. It is therefore necessary for the emission module to have a current mode circuit for providing digital signals with sharp edges and, in the same time, the reception module must have a current mode circuit for supplying reliable digital signals to the other circuits of the reception module.

The above and other features and advantages of the invention will be apparent from the following description of exemplary embodiments of the invention with reference to the accompanying drawings, in which:

DETAILED DESCRIPTION OF INVENTION

Figure 1:
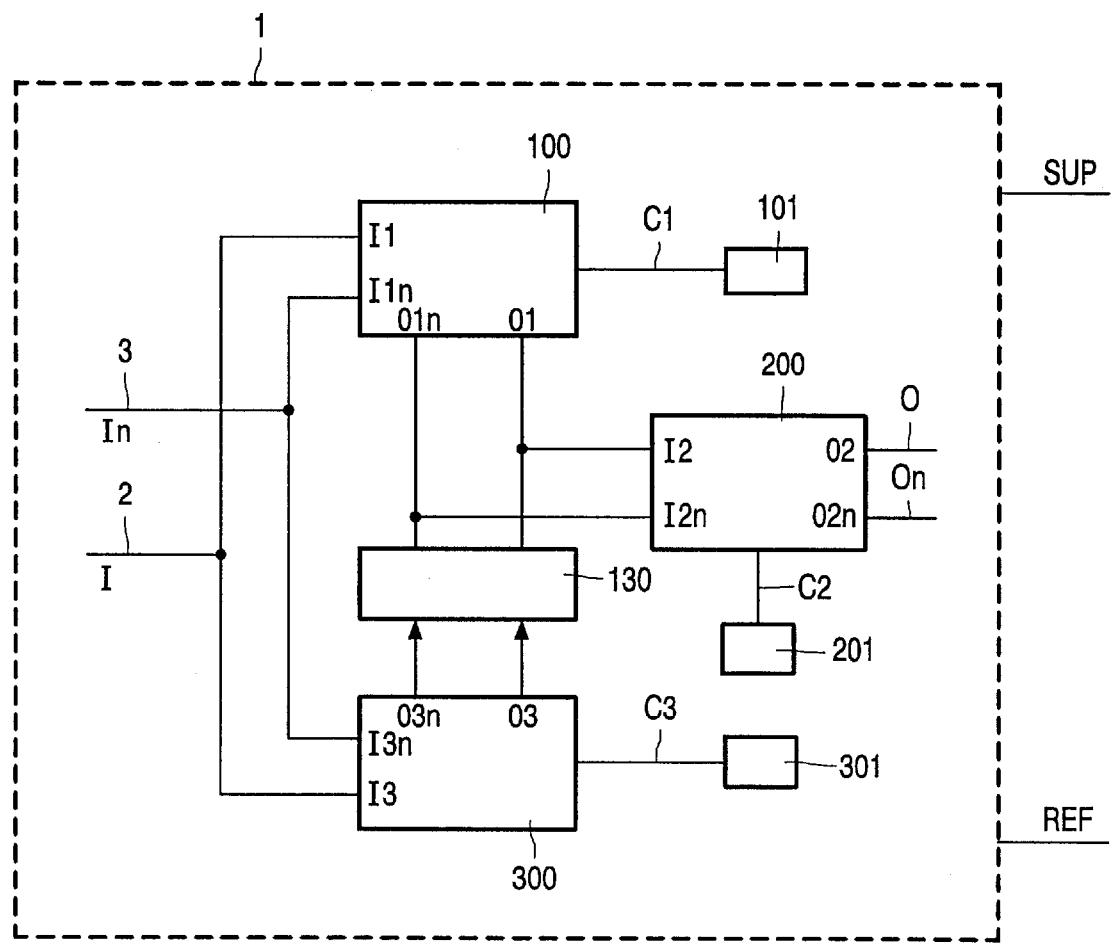
FIG. 1 depicts a block diagram of the current mode circuit (CMD), according to the invention.

FIG. 1 shows the block diagram of the current mode circuit (CMD) 1, according to the invention. The CMD 1 comprises a first pair 100 of voltage controlled current sources (CCS) having an active load 130, the CMD further comprising a second pair 200 of CCS and a third pair 300 of CCS. The first pair 100 is supplied with a current C1 by a first current source 101, the second pair 200 is supplied with a current C2 by a second current source 201 and the third pair is supplied with a third current C3 by a third current source 301. The first pair 100 has a first input I1 and a second input I1n coupled to a first input terminal 2 and to a second input terminal 3, respectively. The third pair 300 has a fifth input I3 and a sixth input I3n also coupled to the input terminal 2 and to the input terminal 3, respectively. The first pair 100 has an active load 130 that is controlled by the third pair 300 via the outputs O3 and O3n, respectively. The signals through the outputs O1 and O3, and outputs O1n and O3n, are substantially in phase, the overall amplification of the first pair being controlled.

The signals provided by the outputs O1 and O1n are delivered to the third input I2 and fourth input I2n of the second pair 200, respectively. The second pair 200 is supplied by the second current source 201 with the current C2, which determines the amplification of the second stage 201. The third output O2 and the fourth output O2n provides the first logical output signal O and the second digital output signal On, respectively.

It should be pointed out here that the delay through the first pair is controlled by the ratio between the currents C1 and C3, the overall amplification and therefore the overall delay of the CMD 1 being controlled by a ratio of the currents C2 and C3.

Figure 2:
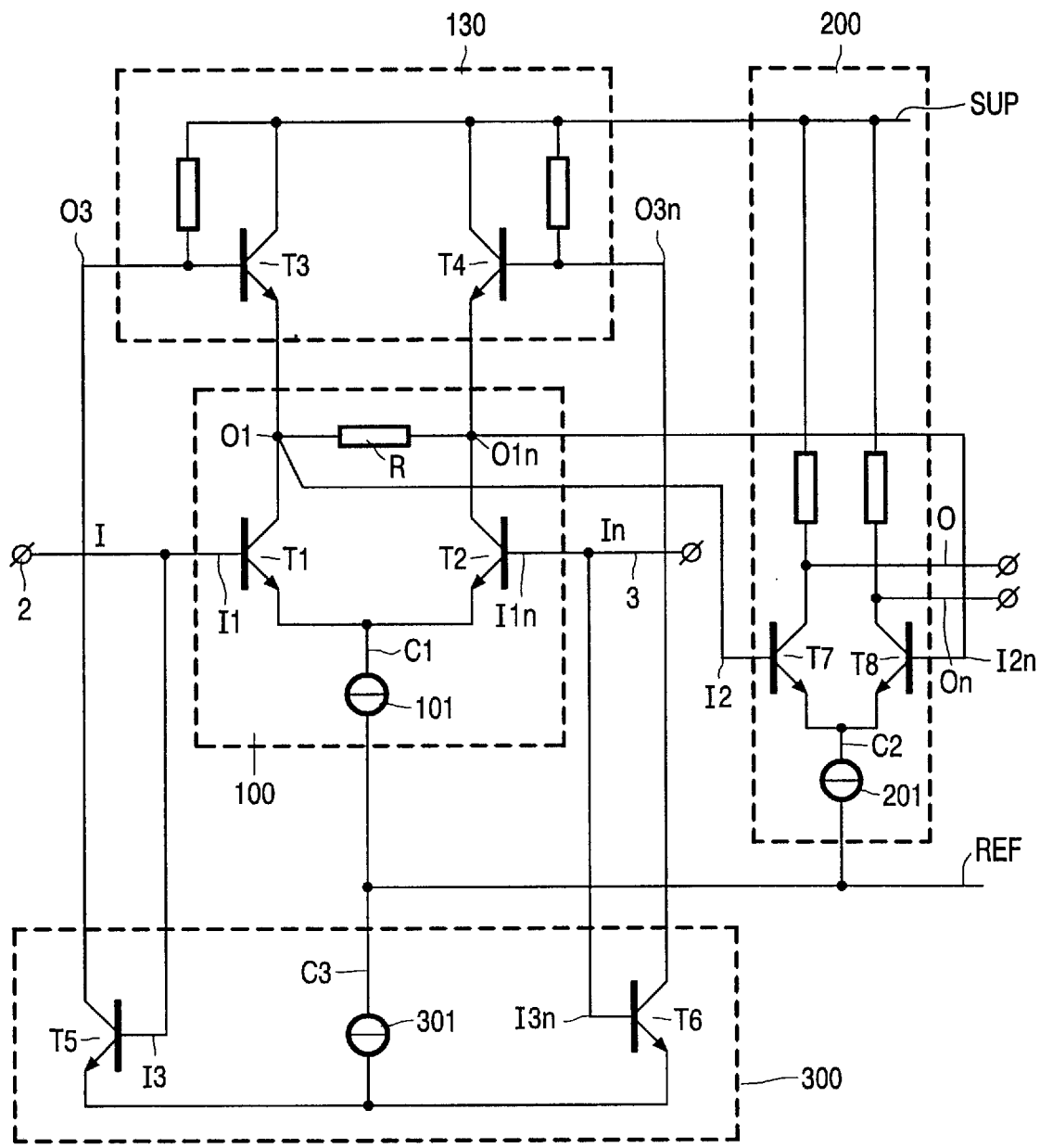
FIG. 2 depicts a bipolar implementation of the CMD according to one embodiment of the invention.

FIG. 2 depicts a bipolar implementation of the CMD 1 according to one embodiment of the invention. For illustrative purposes, bipolar transistors were used. However, the circuit may be implemented either in bipolar, CMOS or BiCMOS technologies, or a combination there of. For bipolar transistors, the control electrode, first main electrode and second main electrode correspond to the base, emitter and collector, respectively. For MOS transistors, the control electrode, first main electrode and second main electrode correspond to the gate, source and drain, respectively. Furthermore, the CCS were implemented as transistors but any high speed CCS can be used instead.

Transistors T1 and T2 realize the first pair 100 of CCS, transistors T7 and T8 realize the second pair 200 of CCS and transistors T5 and T6 realize the third pair 300 of CCS. Transistors T3 and T4 realize the active load 130.

For illustrative purposes, the transistors are NPN transistors. However, the circuit may be implemented alternatively with PNP transistors, n-MOS transistors or p-MOS transistors. When the circuit is realized with NPN transistors or n-MOS transistors the terminal SUP is connected to the positive terminal of a DC source and the REF terminal is connected to the negative terminal of the DC source. When the circuit is realized with PNP transistors or p-MOS transistors the terminal SUP is connected to the negative terminal of a DC source and the REF terminal is connected to the positive terminal of the DC source.

The input signals I and In are applied through the terminals 2 and 3, respectively, both to the inputs I and In of the first pair 100 and to the inputs I3 and I3n of the third pair 300. It is easy to observe that the signals at the output O1 and O1n are substantially in phase with the signals O3 and O3n, respectively. The signals transmitted through the terminals O3 and O3n modulate the supply current C3, controlling the active impedance realized with the transistors T3 and T4. Furthermore, the ratio between C1 and C3 controls the amplification of the first pair 100, a ratio between 3 and 10 realizing near optimum amplifications and therefore, near optimum delays, in the circuit. A resistor R is provided between the outputs O1 and O1n for preventing the apparition of slowness of the transistors T3 and T4 when they are driven with relatively small currents. When CMOS technology is involved, the resistor R is used for compensating the junction leakage currents through T3 and T4.

The second pair 200 is a common emitter pair that realizes a relatively high power gain. The signals provided by the first output O1 and the second output O1n are transmitted to the third input I2 and to the fourth input I2n, respectively. The third output terminal O2 and the fourth output O2n provide the first logical output signal O and the second logical output signal On, respectively.

It is remarked that the overall amplification depends on the ratio between the currents C2 and C1, and may be varied taking into account a specific application.

Figure 3:
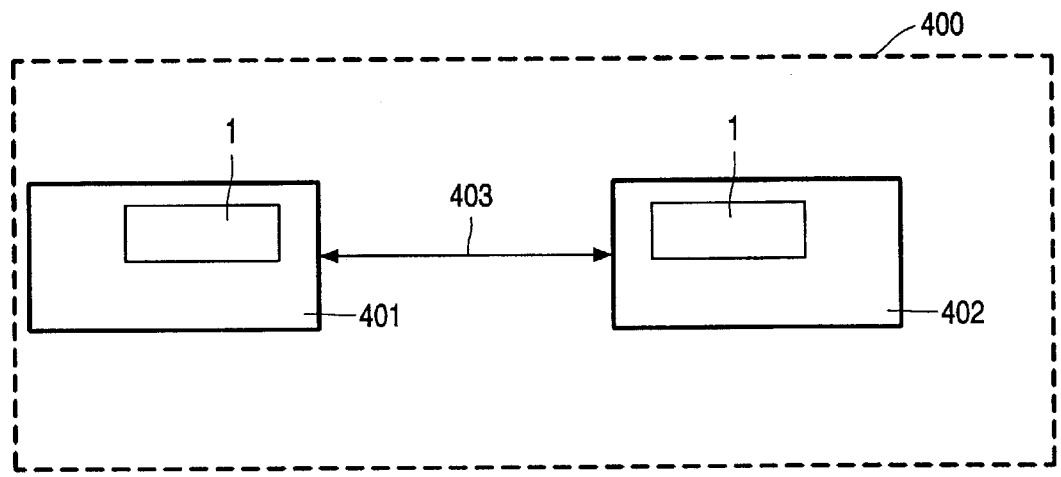
FIG. 3 depicts a communication arrangement comprising CMD.

FIG. 3 depicts a communication arrangement comprising CMD 1. The arrangement 400 comprises an emission module 401 coupled with a reception module 402 via a bi-directional communication channel 403, further comprising a current mode circuit according to the invention in the emission module 401 and in the reception module 402. It should be emphasize that the term "bi-directional" does dot exclude a unidirectional channel.

It is remarked that if the communication channel is a long line (a computer network, e.g.) the edges of the digital signals circulating through it deteriorate especially because of the parasitic impedance (capacitors, inductors, e.g.) of the channel. Furthermore, if a very high frequency chip is considered, the connection lines within the chip behave as transmission lines deteriorating the edges of the digital signals. It is therefore necessary that the emission module to have CMD 1 for providing digital signals with sharp edges and, in the same time, the reception 402 module must have a CMD 1 for supplying reliable digital signals to the other circuits of the reception module 402.

Figure 4:
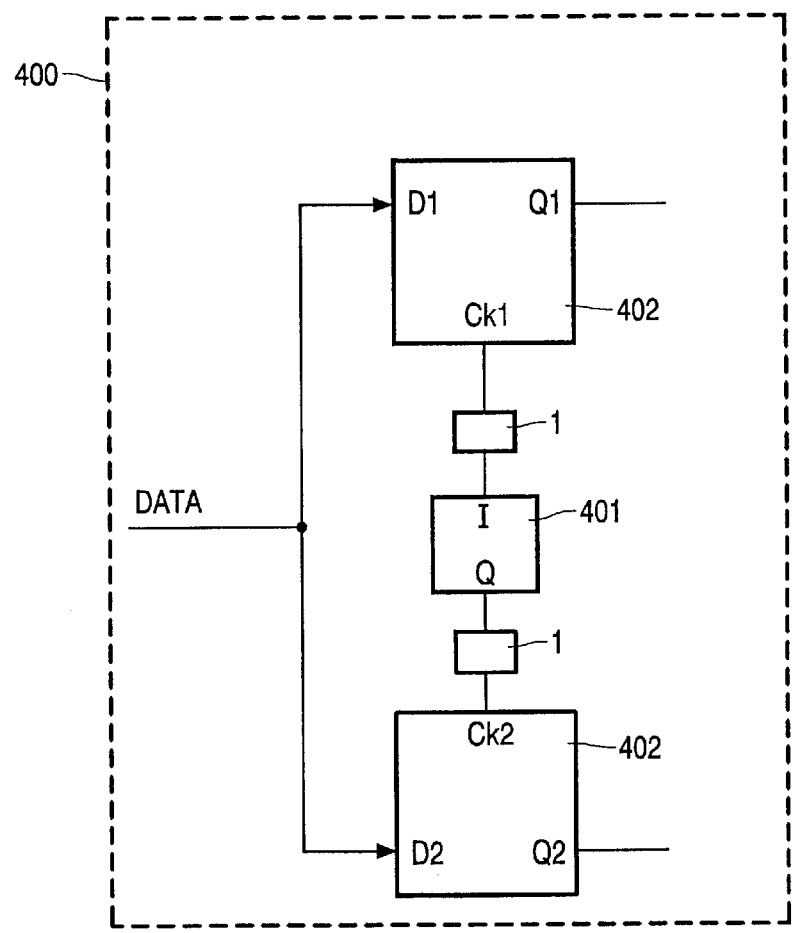
FIG. 4 depicts an interleaved phase/frequency detector in another embodiment of the invention.

FIG. 4 depicts an interleaved phase/frequency detector in another embodiment of the invention.

The emission module is a quadrature oscillator (QO) 401 providing at a first oscillation output I a signal that is phase shifted with almost 90 degrees in comparison with the signal provided by a second oscillator output Q.

The reception circuits comprises a first D flip-flop (DFF) 402 and a second DFF 402. Because the DFF are very sensitive to the edge of the signals provided by the quadrature oscillator, the signals provided by the quadrature oscillator outputs I and Q are first buffered with the CMD 1, and then delivered to the FF.

The first DFF 402 has an input D1 coupled with an input signal DATA and a Clock input Ck1 coupled with the output I of the QO via the CMD 1, generating a signal at an output terminal Q1 which is almost in phase with the positive edge of the signal I. The second DFF 402 has an input D2 coupled with an input signal DATA and a Clock input Ck2 coupled with the output Q of the QO via a second CMD 1, generating a signal at an output terminal Q2 which is almost in phase with the positive edge of the Q signal.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. A Current Mode Device (CMD) (1) being supplied via a first supply terminal (SUP) and a second supply terminal (REF) comprising a first pair of controlled current sources (CCS) (100) being supplied by a first current source (101) adapted to supplying a first current (C1), the first pair of CCS (100) having a first input (I1), a second input (I1$n$), a first output (O1) and a second output (O1$n$), the first input being coupled to a first input terminal (2) adapted to transmit a first input signal (I) and the second input being coupled to a second input terminal (3) adapted to transmit a second input signal (In), the CMD (1) further comprising a second pair of CCS (200) being supplied by a second current source (201) adapted to supplying a second current (C2), the second pair of CCS (200) having a third input (I2), a fourth input (I2$n$), a third output (O2) and a fourth output (O2$n$), the third input (I2) being coupled with the first output (O1) and the fourth input (I2$n$) being coupled with the second output (O1$n$) for generating a first logical output signal (O) at the third output (O2) and a second logical output signal (On) at the fourth output (O2$n$) depending on the first input signal (I) and on the second input signal (In), respectively, wherein the first and second logical output signals are differential the CMD (1) further comprising an active load circuit (130) being coupled to the first output (O1) and the second output (O1$n$), characterized in that the CMD (1) further comprises a third pair (300) of CCS being supplied by a third current source (301) adapted to supplying a third current (C3) the third pair of CCS having a fifth input (I3) and a sixth input (I3$n$) coupled to the first input terminal (2) and to the second input terminal (3), respectively, for providing a fifth output signal at a fifth output (O3) and a sixth output signal at a sixth output (O3$n$) for controlling an amplification of the first input signal (I) and the second input signal (In) through the first pair of CCS (100).

2. The Current Mode Device as claimed in claim 1 characterized in that the fifth output signal and the sixth output signal control the amplification by varying the impedance of the load circuit (130).

3. The Current Mode Device as claimed in claim 2 characterized in that the signal of the first output (O1) and the signal of the fifth output (O3), and the signal of the second output (O1$n$) and the signal of the sixth output (O3$n$), respectively, are substantially in phase.

4. The Current Mode Device as claimed in claim 1 characterized in that the first current (C1) supplied by the first current source (101), the second current (C2) supplied by the second current source (201) and the third current (C3) supplied by the third current source (301) are variable currents for controlling a delay between the firs logical output signal (O) and the first input signal (I) and between the second logical output signal (On) and the second input signal (In).

5. A communication arrangement (400) comprising an emission module (401) coupled with a reception module (402) via a bi-directional communication channel (403), further comprising in the emission module (401) and in the reception module (402) the Current Mode Device (1) as claimed in claim 1.

* * * * *

UNITED STATES PATENT AND TRADEMARK OFFICE
CERTIFICATE OF CORRECTION

PATENT NO. : 6,693,463 B2
DATED : February 17, 2004
INVENTOR(S) : Paul Mateman

It is certified that error appears in the above-identified patent and that said Letters Patent is hereby corrected as shown below:

Title page,
Insert Item:

-- [73] Assignee: Koninklijke Philips Electronics N.V.,
  Eindhoven (NL) --.

Signed and Sealed this

Twenty-ninth Day of June, 2004

JON W. DUDAS
*Acting Director of the United States Patent and Trademark Office*